United States Patent
Yun et al.

(10) Patent No.: US 6,433,386 B1
(45) Date of Patent: *Aug. 13, 2002

(54) SENSE FET HAVING A SELECTABLE SENSE CURRENT RATIO AND METHOD OF MANUFACTURING THE SAME

(75) Inventors: Chong-man Yun; Ki-hyun Lee; Kwang-yeon Jun, all of Bucheon (KR)

(73) Assignee: Samsung Electronics Co., Ltd., Suwon (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/161,116

(22) Filed: Sep. 25, 1998

(30) Foreign Application Priority Data

Oct. 20, 1997 (KR) .............................. 97-54215

(51) Int. Cl.$^7$ ............................... H01L 29/76
(52) U.S. Cl. ................... 257/341; 257/342; 257/343; 257/401; 257/529
(58) Field of Search ................ 257/341, 529, 257/342, 343, 401, 500

(56) References Cited

U.S. PATENT DOCUMENTS

| | | | | |
|---|---|---|---|---|
| 4,413,272 A | * | 11/1983 | Mochizuki et al. | ......... 257/529 |
| 4,783,690 A | * | 11/1988 | Walden et al. | ............. 357/23.4 |
| 4,931,844 A | * | 6/1990 | Zommer | ..................... 357/23.4 |
| 4,945,398 A | * | 7/1990 | Kurita et al. | ................ 257/529 |
| 5,021,861 A | * | 6/1991 | Baliga | ......................... 257/529 |
| 5,410,163 A | * | 4/1995 | Murakami | ................... 257/529 |
| 5,442,216 A | * | 8/1995 | Gough | ........................ 257/355 |
| 5,530,277 A | * | 6/1996 | Otsuki et al. | ............... 257/341 |

* cited by examiner

Primary Examiner—Sara Crane
(74) Attorney, Agent, or Firm—Marger Johnson & McCollom, P.C.

(57) ABSTRACT

A sense FET is provided that is capable of achieving one of many available sense current ratios after manufacture, and a method of manufacturing the same. The sense FET includes a main cell array of MOSFET cells connected in parallel, and a main pad connected to the sources of the main cells. A plurality of unit sense cells are arranged in arrays, and also optionally in groups corresponding to portions of the arrays. A plurality of sense pads are electrically insulated from each other. Each sense pad is connected to the sources of the unit sense cells of either a complete sense cell array, or of a group corresponding to a portion of an array. Every sense pad is connected either to the sense resistor or to the main pad. When connected to a sense resistor, the corresponding unit cells are used as sense cells. For every different combination of sense pads that are connected to the sense resistor, a different number of unit cells are used as sense cells, and therefore a different sense current ratio is effectuated for the device. Connection to the sense resistor is by a reconfigurable wire bonding process, or by cutting electrically metal thin film fuses that initially connect the sense pads. The fuses can also initially join the sense pads to the main pad. This way the unit cells of unused sense pads can act instead as main cells.

24 Claims, 6 Drawing Sheets

SENSE FET HAVING A SELECTABLE SENSE CURRENT RATIO AND METHOD OF MANUFACTURING THE SAME

CROSS REFERENCE TO RELATED APPLICATIONS

This application claims priority from Korean Priority Document No. 97-54215, filed on Oct. 22, 1997 with the Korean Industrial Property Office, which document is hereby incorporated by reference.

BACKGROUND OF THE INVENTION

1. Field of the Invention

The present invention relates to a power semiconductor device, and more particularly to a sense FET having additional sense pads.

2. Description of the Related Art

Power MOSFETs are used for applications such as switching mode power supplies, lamp ballasts, motor driving circuits, etc. They have simple driving circuits and relatively low time delays as switching devices or control devices for supplying power to loads.

A power MOSFET is typically composed of an array in which thousands to tens of thousands of switching cells are connected in parallel on one chip. The amount of load current passing through the power MOSFET is measured by a voltage drop in a fractional value power resistor which is in series with the load current path.

A problem is that these resistors consume too much power due to the high load current, which reduces the overall system efficiency. Also, fractional value power resistors cost more than common carbon resistors.

A sense FET that has been proposed recently is shown in FIG. 1. The sense FET includes a main FET Qm and a sub FET Qs. The main FET and the sub FET are connected in parallel, but two sources are provided. Main source Sm of the main FET is grounded, while sense source Ss of the sub FET is connected to an external sense resistor Rs(ext), to thereby detect a voltage drop Vs of the sense resistor. The connection to Rs(ext) is external, accomplished via a pin of the sense FET package.

Each of Qm and Qs is made from a large number of cells. Since the main cells are structured identically to the sense cells, their current-voltage characteristics are identical. The number ratio n of the main cells over the sense cells has a value of hundreds or thousands.

The sub FET is designed to carry a predetermined percentage of the current carried by the main FET as follows. Current Id, supplied to a drain D of the sense FET is divided between a current Im going through main FET Qm and a current Is going through sub FET Qs. Since an on-resistance value of the MOSFET is inversely proportional to the number of cells in the FET, the on-resistance value of Qs is much higher than that of Qm. So, currents Im and Is have a ratio depending on number ratio n, and total drain current Id is expressed as follows:

$$Id = Is + Im$$
$$= Is + n \cdot Is$$
$$= (n+1) \cdot Is$$

Therefore Is is a very small fraction of Id; in other words, by far most of total drain current Id flows through Qm as Im.

In addition, a voltage Vs appearing across sense resistor Rs(ext) is given by:

$$Vs = Rs(ext) \cdot Is$$
$$= Rs(ext) \cdot Id / (n+1)$$

The above equation is solved for total drain current Id as follows:

$$Id = Vs \cdot (n+1)/Rs(ext)$$

Accordingly, total drain current Id can be estimated by measuring voltage drop Vs, and then using the known values of n, Rs(ext) in the above equation. This technique permits estimating the total current by using a sample current of only several mA, which consumes only a small amount of power, and thus permits the use of a common carbon resistor.

The current ratio (sense current ratio) Im/Is of the main FET and the sub FET is a very important test item for the sense FET. The ratio needs to be maintained at a designed level to measure the load current more exactly.

In general, the desired sense current ratio depends on the circuit that the sense FET is intended to be applied to. This means that a different number ratio n must be used in each case, and thus different numbers of sense cells for a given number of main cells. Accordingly, different applications require different designs of sense FETs, which prevents a manufacturing efficiency from being high.

Even worse, the sense current ratio may turn out to be different from what was originally designed for, depending on the material used for producing the sense FET. It may be different enough to where the sense FET is unusable for the intended application.

SUMMARY OF THE INVENTION

To solve the above problems, it is an object of the present invention to provide a sense FET capable of providing a number of available sense current ratios, any one of which can be selectable after manufacture. It is also an object of the invention to provide a method for manufacturing such a FET.

Accordingly, to achieve the above object, a sense FET made according to the invention includes a main cell array of MOSFET cells connected in parallel, and a main pad connected to the sources of the main cells. The sense FET further includes a plurality of unit sense cells arranged in arrays, and also optionally in groups corresponding to portions of arrays. The sense cells have drains and gates connected respectively to the drains and gates of the cells of the main cell array. Their structure is preferably identical to that of the cells of the main cell array, so that they share the same current-voltage characteristics.

The sense FET further includes a plurality of sense pads that are electrically insulated from each other as well as from the main pad. Each sense pad is connected to the sources of the unit sense cells of either a complete sense cell array, or of a group corresponding to portions of an array. When a sense pad is effectively connected to a sense resistor, the unit cells that it is connected to are used as sense cells.

In the first embodiment of the invention, different sense pads or combinations of sense pads are effectively connected to the sense resistor by a reconfigurable wire bonding process. For every such configuration, a different number of unit cells is effectively chosen to act as sense cells, and therefore a different sense current ratio is effectuated for the device.

In the second embodiment, one of the sense pads (whose unit cells are always to be used as sense cells) is connected directly to the sense resistor. Other sense pads can be connected to that pad by a metal thin film fuse, that can be cut later with an overcurrent to effectuate a different sense current ratio.

In the third embodiment the unit cells connected to unused sense pads are used as main cells by the main cell array. This is accomplished by having all sense pads initially connected to the main pad with fuses. Then, for only the pads whose unit cells will be used as sense cells, the fuses are cut, and wire bonding effectively connects them to the sense resistor.

Accordingly, a sense FET made according to the present invention makes available a number of possible sense current ratios. The invention permits selecting one of the available ratios by a selection of a proper number of unit cells to act as sense sells. The unit cells are selected by selecting an appropriate combination of sense pads with the processes of cutting fuses and wire bonding.

According to a method of the invention, a sense FET is formed that has a selectable sense current ratio. The method has the steps of forming a main cell array with a plurality of MOSFET cells connected in parallel, and forming a plurality of unit sense cells. The unit sense cells have drains and gates connected to the drains and gates respectively of the main MOSFET cells. The unit sense cells are arranged in at least two groups.

A main pad is formed that is electrically connected to the sources of the MOSFET cells. A plurality of sense pads is further formed, each electrically connected to the sources of the unit sense cells of a single group.

The sense pads are connected either to the sense resistor or to the main pad. They are so connected either by thin film metal fuses or by subsequent wire bonding. An initial connection scheme can be reconfigured by changing the wire bonding, or by electrically cutting one or more fuses with an overcurrent.

The sense resistor is also electrically connected to the main pad, and then the sense current ratio is measured. The measurement can reveal a need for reconfiguring the connection scheme.

The invention permits a single initial design for many possible sense current ratios, which increases a design efficiency. This also permits manufacturing a single device for many purposes, which reduces manufacturing costs.

BRIEF DESCRIPTION OF THE DRAWINGS

The above object and advantages of the present invention will become more apparent by describing in detail embodiments thereof with reference to the attached drawings, which are not necessarily to scale and in which.

DESCRIPTION OF THE PREFERRED EMBODIMENTS

Figure 1:
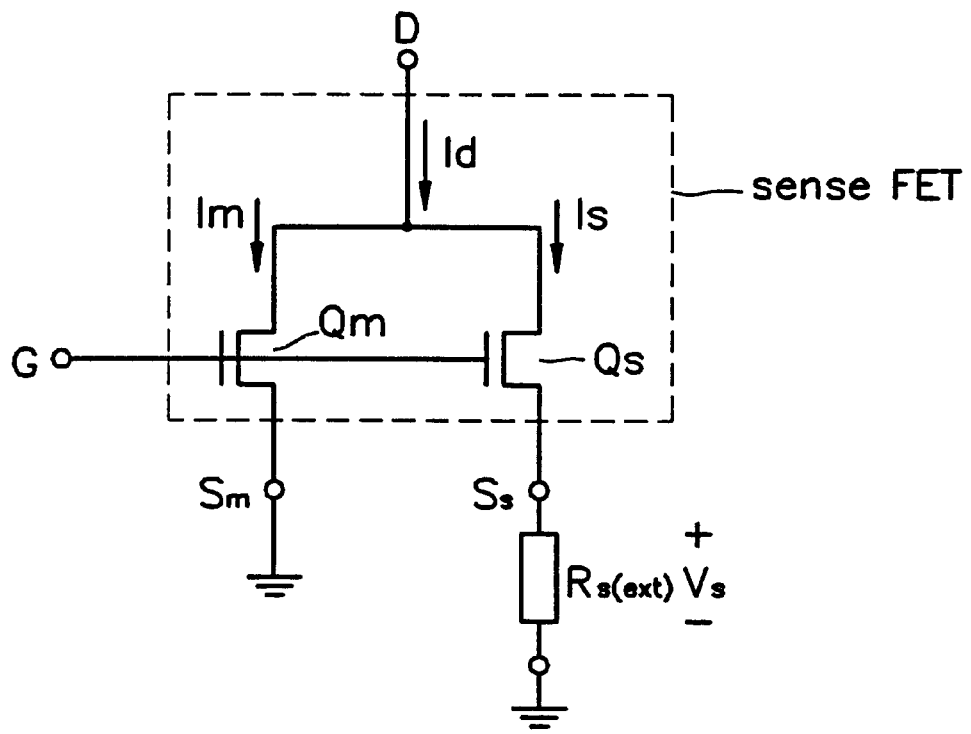
FIG. 1 is an equivalent circuit diagram of a conventional sense FET.
Figure 2:
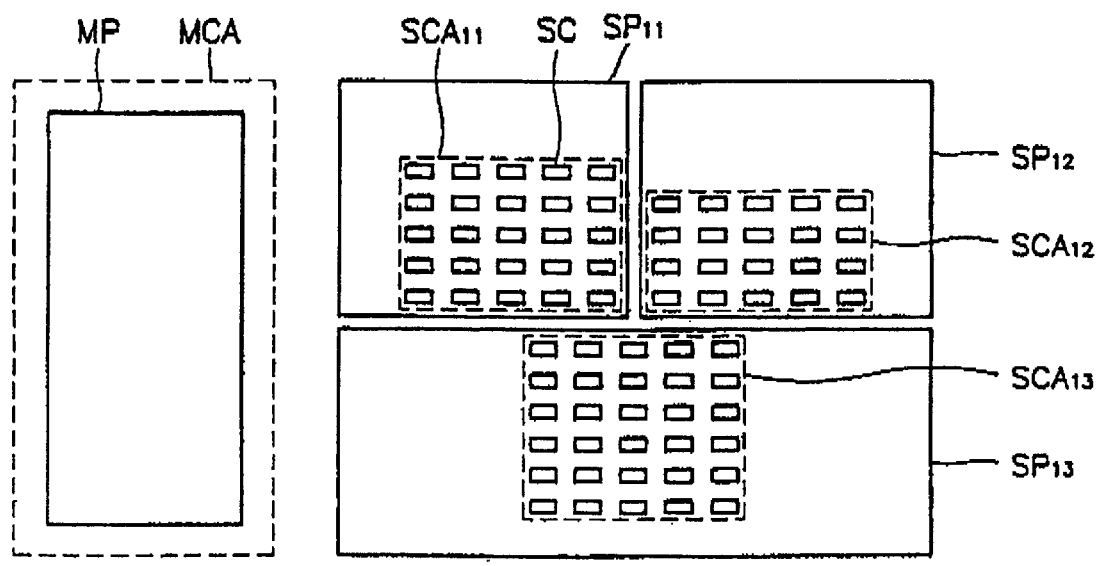
FIG. 2 is a plan view schematically showing a sense cell portion of the sense FET according to a first embodiment of the present invention.

A first embodiment of the present invention is now described with reference to FIGS. 2 and 3. Referring to FIG. 2, the sense FET includes a main cell array MCA, a main pad MP, and a plurality of sense cell arrays $SCA_{11}$, $SCA_{12}$ and $SCA_{13}$. Each sense cell array has a plurality of unit sense cells SC of similar or different numbers. The unit sense cells are connected in parallel within each sense cell array.

The sense FET further includes a plurality of sense pads $SP_{11}$, $SP_{12}$ and $SP_{13}$ corresponding to arrays $SCA_{11}$, $SCA_{12}$ and $SCA_{13}$ respectively. The source of each unit sense cell (sense source) is connected to the corresponding sense pad. For example, each source of the unit sense cells of first sense cell array $SCA_{11}$ is connected to a first sense pad $SP_{11}$. Accordingly, each of sense cell arrays $SCA_{11}$, $SCA_{12}$ and $SCA_{13}$ is connected to the corresponding one of sense pads $SP_{11}$, $SP_{12}$ and $SP_{13}$. A person skilled in the art will discern that an equivalent circuit may be implemented by interchanging the sources and the drains, etc.

Preferably, the structure of each unit sense cell SC is identical to that of each unit cell of the main cell array (a.k.a. main cell), so that they have the same current-voltage characteristics. Sense cell arrays $SCA_{11}$, $SCA_{12}$ and $SCA_{13}$ are electrically insulated from each other and from the main cell array. Further, sense pads $SP_{11}$, $SP_{12}$ and $SP_{13}$ are connectable to a terminal of a sense FET package by a wire such as during a wire bonding process.

In this first embodiment the sense pads are electrically insulated from each other. According to a method of the invention, the sense current ratio can be selected to be one of different available values. This is accomplished by selecting which sense pad(s) to effectively connect to external sense resistor Rs(ext).

Figure 3:
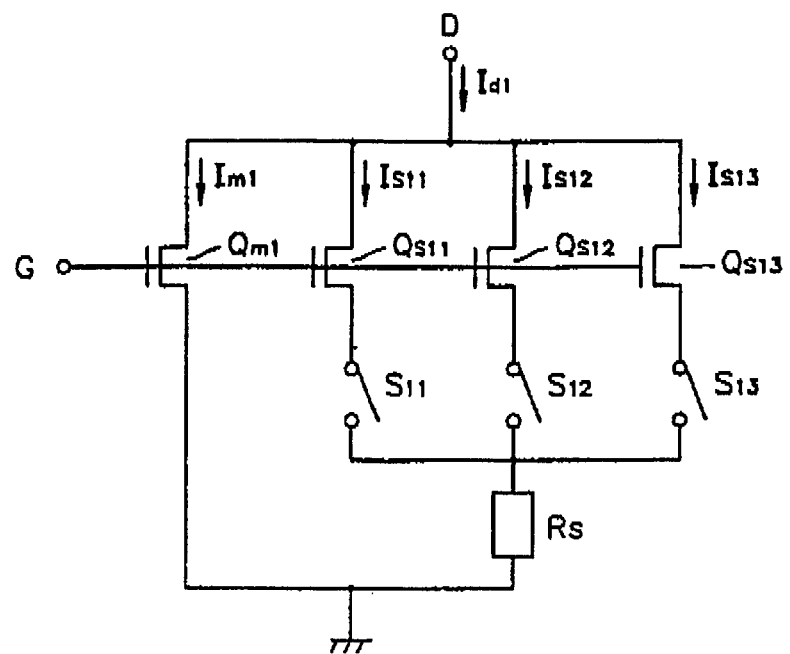
FIG. 3 is an equivalent circuit diagram of the sense FET of FIG. 2.

Referring now to FIG. 3, the sense FET includes a main FET $Qm_1$ and three sub FETs $Qs_{11}$, $Qs_{12}$ and $Qs_{13}$ connected in parallel. Each sub FET is connectable to a sense source Ss through respective switches $S_{11}$, $S_{12}$ and $S_{13}$, shown drawn vertically. In the representation of FIG. 3, sub FETs $Qs_{11}$, $Qs_{12}$ and $Qs_{13}$ correspond respectively to each of sense cell arrays $SCA_{11}$, $SCA_{12}$ and $SCA_{13}$, of FIG. 2. In addition, the three switches are considered to be closed or open by effectuating wire-bonding or not. Sense source Ss is externally connected to external sense resistor Rs(ext).

For example, when in FIG. 2 the wire (not shown) is bonded only to first sense pad $SP_{11}$, then in FIG. 3 first switch $S_{11}$ is considered closed, while second and third switches $S_{12}$ and $S_{13}$ are considered open. Current $Id_1$, supplied to drain D of the sense FET, is divided into a main current $Im_1$ going through main FET $Qm_1$, and a sub current $Is_{11}$ going through first sub FET $Qs_{11}$. The ratio of current $Im_1$ to current $Is_{11}$ depends on the ratio of the number of cells of $Qm_1$ to that of $Qs_{11}$.

However, if the wire is bonded instead to second sense pad $SP_{12}$, then second switch $S_{12}$ is considered closed, instead of $S_{11}$. Then drain current $Id_1$ is divided into main current $Im_1$ and sub current $Is_{12}$ going through second sub FET $QS_{12}$. Then the sense current ratio depends on the ratio of the number of cells of $Qm_1$ to that of $Qs_{12}$, instead of to that of $Qs_{11}$.

As can be seen, selecting pads during the process of wire bonding enables different numbers of unit cells to be selected, which therefore amounts to selecting one of different available values for the sense current ratio. Further, the ratio can be changed by an additional wire-bonding process that selects a combination of sense pads. Accordingly, the present invention provides a sense FET with a selectable sense current ratio.

The second embodiment of the present invention is now described with reference to FIG. 4 and FIG. 5. The second embodiment is similar to the first, except that insulating the plurality of sense pads is accomplished by cutting the appropriate combination of metal thin film fuses instead of wire-bonding a sense pad.

Figure 4:
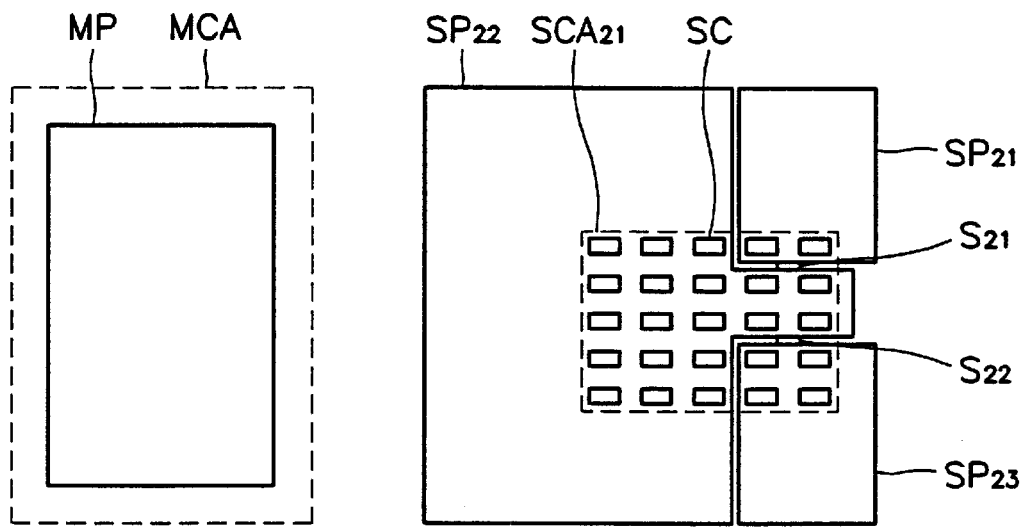
FIG. 4 is a plan view schematically showing a sense cell portion of as sense FET according to a second embodiment of the present invention.

Referring to FIG. 4, the sense FET includes a main cell array MCA, a main pad MP, and a sense cell array $SCA_{21}$ having unit sense cells arranged in groups. It is also preferable that a plurality of sense cell arrays is further provided like in the first embodiment, where each of the sense pads is connected to one of the sense cell arrays.

The sense FET also includes a plurality of sense pads $SP_{21}$, $SP_{22}$ and $SP_{23}$, that are also known in this case as first, second and third sense pads respectively. In this embodiment the sense pads do not correspond to the arrays but to the groups of sense cells corresponding to portions sense cell array $SCA_{21}$. Specifically each of the sense pads is connected to the sources of the unit sense cells of its corresponding group. Different groups can have similar or different numbers of unit sense cells. If different, sense pad $SP_{22}$ can be connected to the largest number.

Sense pad $SP_{22}$ (a.k.a. main sense pad or center sense pad), is connected to sense pads $SP_{21}$ and $SP_{23}$ (a.k.a. auxiliary sense pads) through first and second metal thin film fuses $S_{21}$ and $S_{22}$. Preferably, the fuses are designed such that they can be electrically cut using an overcurrent. By "overcurrent" for purposes of this document it is meant a current of at least 20 mA, notwithstanding how the term may be used in the art. Accordingly, a preferred width of the fuses is between 1 and 5 $\mu$m, and a preferred length is between 10 and 20 $\mu$m. A typical vertical thickness ("depth") is between 3 and 5 $\mu$m.

If the resulting sense current ratio exceeds a design value, then according to a method of the invention one or both of fuses $S_{21}$ and $S_{22}$ are cut. This adjusts the number of the unit cells acting as sense cells, so as to obtain a desired sense current ratio.

For example, if after manufacturing a sense FET according to the invention there is detected a reduction in the sense current ratio due to, say, an increase in the withstand voltage, a tip is used to cut one or both of the fuses. The tip contacts the sense pads joined by a fuse, and applies an overcurrent to them so as to cut the fuse electrically. Accordingly, the number of the unit cells acting as sense cells is reduced, and the sense current ratio is increased.

Figure 5:
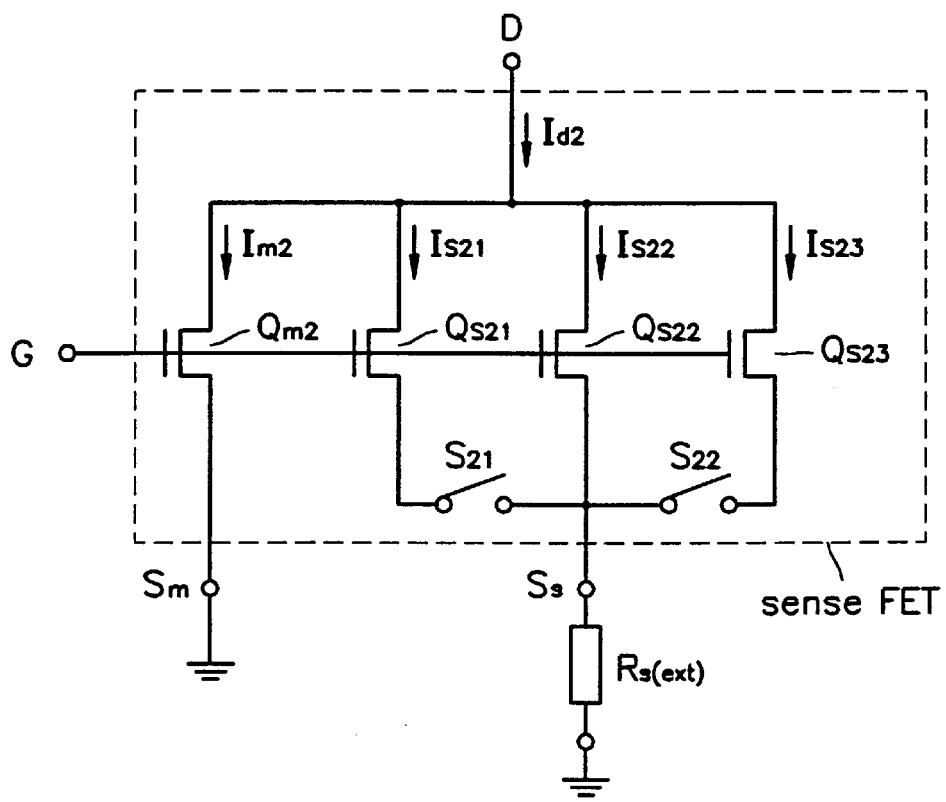
FIG. 5 is an equivalent circuit diagram of the sense FET of FIG. 4.

Referring to FIG. 5, the sense FET includes a main FET $Qm_2$ and three sub FETs $Qs_{21}$, $Qs_{22}$ and $Qs_{23}$ connected in parallel. Second sub FET $Qs_{22}$ is always connected to sense source Ss. The second sub FET is also connected to the other sub FETS through first and second switches $S_{21}$ and $S_{22}$, shown drawn horizontally. These switches are another way of viewing fuses $S_{21}$ and $S_{22}$. The switches are considered to be closed while the respective fuses are intact, and open after the fuses have been cut.

For example, when fuse $S_{21}$ of FIG. 4 is cut, first switch $S_{21}$ is considered open. Then drain current $Id_2$ is divided only into main current $Im_2$ and second and third sub currents $Is_{22}$ and $Is_{23}$. What was sub current $Is_{21}$ has been redistributed among these currents in a way that has increased the sense current ratio.

Accordingly, the sense FET of the second embodiment makes it possible to increase the sense current ratio by reducing the number of the unit cells acting as sense cells. This is accomplished by cutting one or more of the fuses of the pads that make their corresponding cells operate as sense cells.

The third embodiment of the present invention is now described with reference to FIG. 6 and FIG. 7. The third embodiment is similar to the first and the second embodiments, except that it further allows unit sense cells that are not selected to operate as sense cells to be used as main cells. Sense pads are selected by cutting their fuses as in the second embodiment, and wire-bonding them as in the first embodiment.

Figure 6:
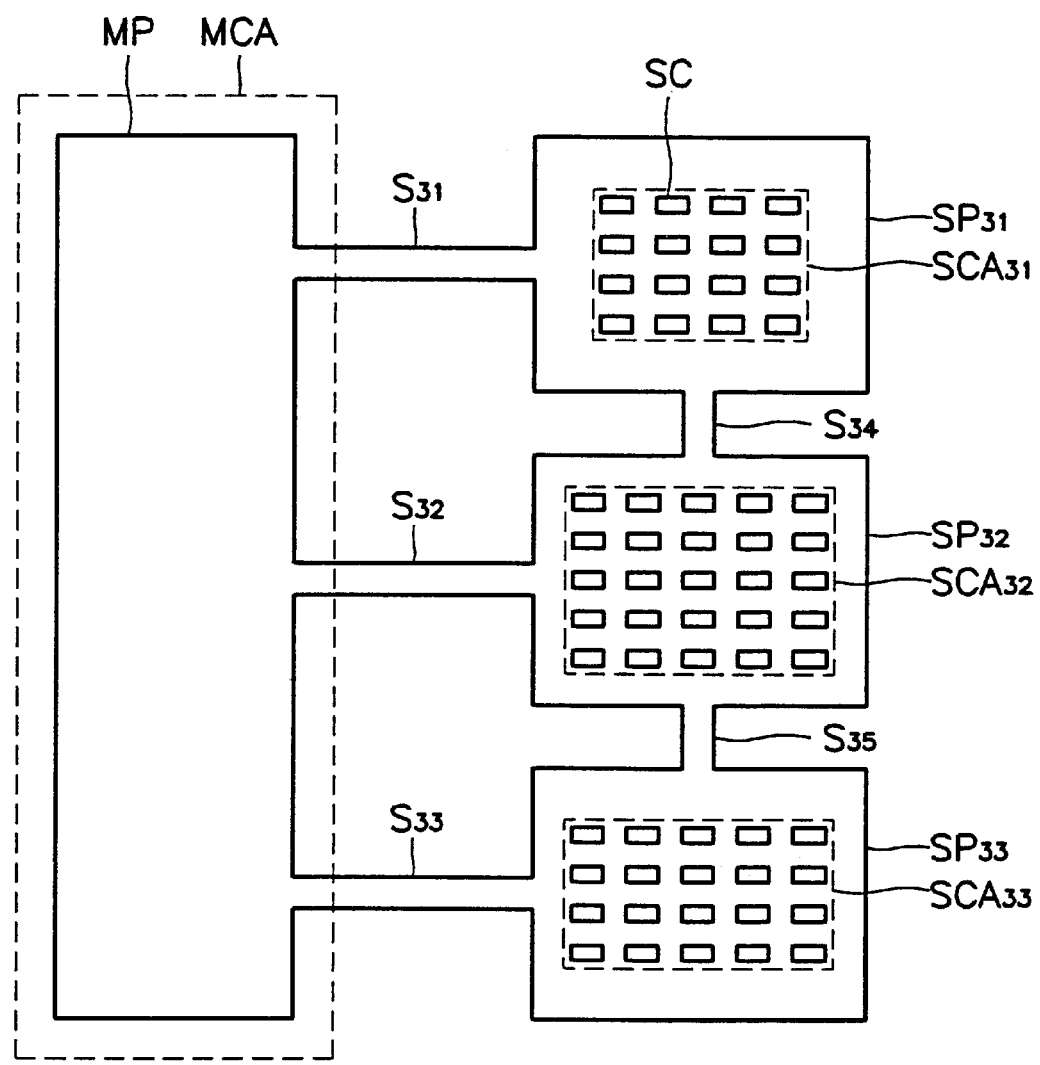
FIG. 6 is a plan view schematically showing a sense cell portion of the sense FET according to a third embodiment of the present invention.

Referring to FIG. 6, the sense FET includes a main source pad MP and a main cell array MCA. It also includes a plurality of sense cell arrays $SCA_{31}$, $SCA_{32}$ and $SCA_{33}$, that are also known as first, second and third sense cell arrays. Each sense cell array has similar or different numbers of unit sense cells SC as the other.

The sense FET further includes a plurality of sense pads $SP_{31}$, $SP_{32}$ and $SP_{33}$, corresponding respectively to the first, second and third sense cell arrays. Unlike in the first two embodiments, sense pads $SP_{31}$, $SP_{32}$ and $SP_{33}$ are connected also to main source pad MP through first, second and third metal thin film fuses $S_{31}$, $S_{32}$, $S_{33}$ respectively. This is to enable an alternate use of their respective sense cells as main cells. Further, the sense pads are connected to each other through metal thin film fuses $S_{34}$ and $S_{35}$. It is preferable that fuses $S_{31}$–$S_{35}$ are designed to be cuttable using overcurrent. These fuses can have the same dimensions as those of FIG. 4.

In the sense FET of the third embodiment it is determined which combination of sense cell arrays will yield the desired sense current ratio. Then it is determined which sense pads correspond to the sense cell arrays. These sense pads are selected by cutting the fuses that connect them to the main pad and the unselected sense pads, and then wire bonding them to sense source Ss, and thus also effectively connecting them to the sense resistor.

For example, to select first sense pad $SP_{31}$, fuses $S_{31}$ and $S_{34}$ are cut, which insulates pad $SP_{31}$ from main pad MP and from sense pads $SP_{32}$ and $SP_{33}$. Then the first sense pad is wire bonded to sense source Ss.

The second and third sense pads $SP_{32}$ and $SP_{33}$ can remain connected to main pad MP, so that their respective sense cell arrays $SCA_{32}$ and $SCA_{33}$ can be used as parts of the main cell array. Alternately their fuses can be cut to further fine tune the sense current ratio of the device, although not by very much. This, however, permits them to float during operation.

Figure 7:
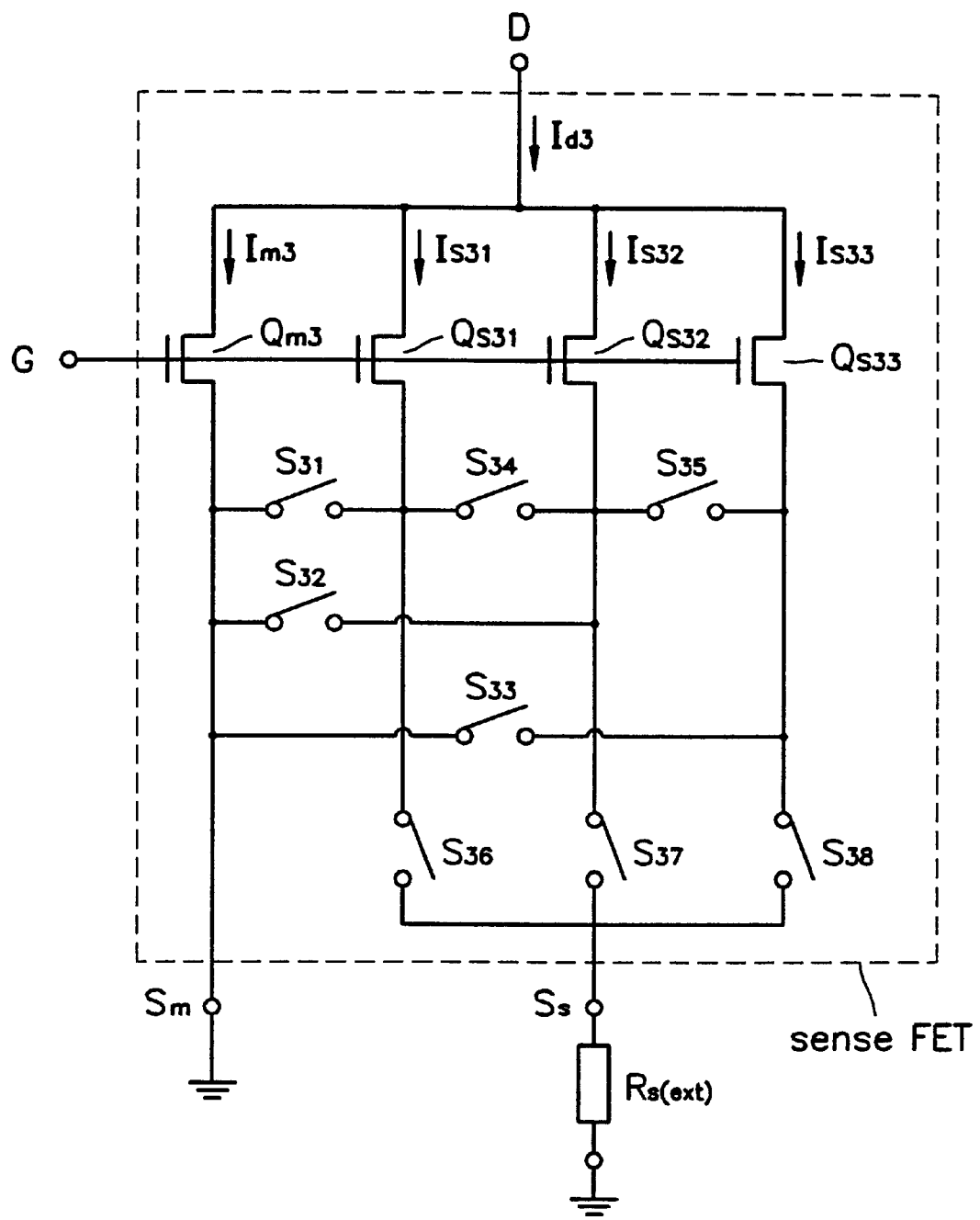
FIG. 7 is an equivalent circuit diagram of the sense FET of FIG. 6.

Referring to FIG. 7, the sense FET includes one main FET $Qm_3$ and three sub FETS $Qs_{31}$, $Qs_{32}$ and $Qs_{33}$ connected in parallel. The main FET is connected to each one of the sub FETs through horizontally drawn switches (really, fuses) $S_{31}$, $S_{32}$ and $S_{33}$ as shown. The sub FETs are also connected to each other through switches (again, fuses) $S_{34}$ and $S_{35}$. The sub FETs are further connectable to a sense source Ss through vertically drawn switches (really, wire bonds) $S_{36}$, $S_{37}$ and $S_{38}$. The sense source is connected externally to the external sense resistor Rs(ext).

For example, to isolate $Qs_{31}$ (which corresponds to $SP_{31}$), fuses $S_{31}$ and $S_{34}$ are cut, which corresponds to opening switches $S_3$, $S_{34}$. (Switches $S_{32}$, $S_{33}$, $S_{35}$ remain closed.) Further, the wire is bonded to first sense pad $SP_{31}$, which corresponds to closing switch $S_{36}$. (Switches $S_{37}$, $S_{38}$ remain open.) Accordingly, drain current $Id_3$ is divided into sense sub current $Is_{31}$ and main current $Im_3$ plus $Is_{32}$ plus $Is_{33}$. So, sub currents $Is_{32}$ and $Is_{33}$ act as parts of the main current.

Therefore, the sense FET of the third embodiment permits selecting a sense current ratio by selecting a sense pad through wire-bonding, while the unit cells of the unselected sense pads can be used advantageously as main cells without floating. This makes maximum use of all the cells.

In all three embodiments one or more sense pads are used to select a corresponding group of unit sense cells. The groups are either distinct arrays (first and third embodiments), or include portions of an array (second embodiment).

Figure 8:
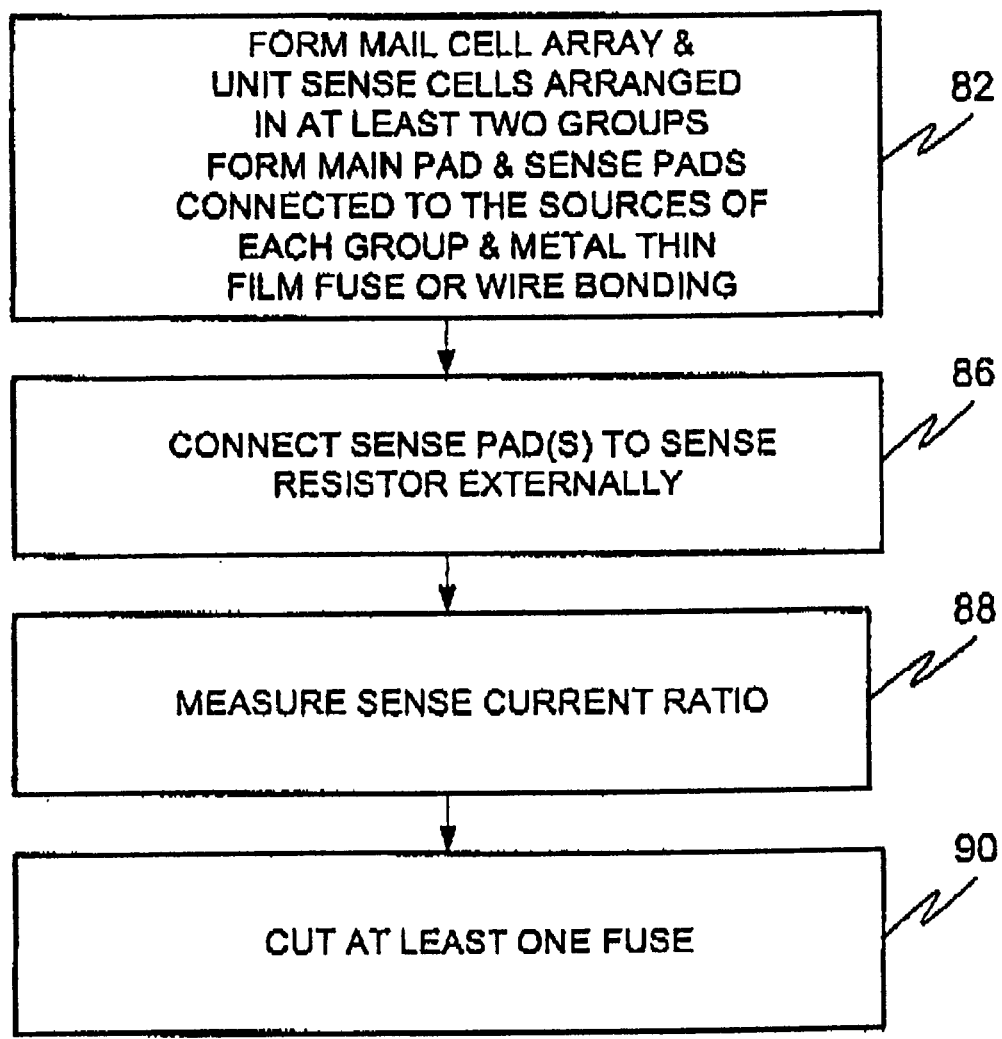
FIG. 8 is a flowchart illustrating a method of the invention.

Referring to FIG. 8, a method is now described according to the present invention. The method is for forming a sense FET having a selectable sense current ratio.

As seen in step 82, a main cell array is formed that has a plurality of MOSFET cells connected in parallel, and are also known as main cells. A plurality of unit sense cells is also formed, that have drains and gates connected to the drains and gates respectively of the main MOSFET cells. The unit sense cells are arranged in at least two groups.

A main pad is formed that is electrically connected to the sources of the MOSFET cells. A plurality of sense pads is also formed. Each sense pad is electrically connected to the sources of the unit sense cells of a single group.

The sense pads are connected either to the sense resistor or to the main pad. They are so connected either by thin film metal fuses or by subsequent wire bonding. An initial connection scheme can be reconfigured by changing the wire bonding, or by electrically cutting one or more fuses with an overcurrent. So, the exact order of the steps described below can be different in every case, as has been learned from the above description.

Optionally at least one of the sense pads is connected to another one of the sense pads. This can be performed by forming a thin film metal fuse joining the sense pads. It is advantageous to form the fuse as part of the manufacturing process of the main cell array and the sense cell array. Alternately the sense pads can be wire bonded together at a later stage.

Referring to step 86, at least one sense pad is connected to one terminal of an external sense resistor. This can be performed by forming a thin film metal fuse joining the sense pad and a sense source, which in turn is connected to the resistor terminal. It is advantageous to form the fuse as part of the manufacturing process of the main cell array and the sense cell array. Alternately step 86 can performed by wire bonding at a later stage. Connection to the sense resistor selects the cells of the sense pad to act as sense cells.

Referring to step 88, the other terminal of the sense resistor is electrically connected to the main pad, or to a conductor (such as ground) that the main pad is connected to. Connection can be by wire bonding. Then the sense current ratio is measured. The measurement can reveal a need for reconfiguring the connection scheme.

Referring to step 90, optionally a fuse is cut electrically by overcurrent as part of reconfiguring the connection scheme. This step can be performed at any time after manufacturing the main cell array. The measurement of step 88 can then be repeated, to ascertain that the sense current ratio is at the desirable level.

What is claimed is:

1. A sense FET comprising:
   a main cell array having a plurality of MOSFET cells connected in parallel;
   a main pad electrically connected to sources of the MOSFET cells of the main cell array;
   a plurality of sense cell arrays composed of a plurality of unit sense cells having drains and gates connected to drains and gates respectively of the MOSFET cells of the main cell array, wherein the sense cell arrays are composed of different numbers of unit sense cells; and
   a plurality of sense pads corresponding to each of the plurality of sense cell arrays, each sense pad being electrically connected to sources of the unit sense cells of the corresponding sense cell array.

2. The sense FET of claim 1, wherein each of the sense cell arrays is composed of a predefined number of unit sense cells.

3. The sense FET of claim 1, wherein the structure of the unit sense cells is identical to that of the MOSFET cells of the main cell array.

4. The sense FET of claim 1, wherein the sense pads are electrically insulated from each other and from the main pad.

5. A sense FET comprising:
   a main cell array having a plurality of MOSFET cells connected in parallel;
   a main pad electrically connected to sources of the MOSFET cells of the main cell array;
   a sense cell array composed of a plurality of unit sense cells arranged in groups, each unit sense cell having a gate and drain connected to gates and drains respectively of the MOSFET cells of the main cell array;
   a plurality of sense pads each of which has at least one center sense pad to which a wire is to be connected and at least one auxiliary sense pad to which the wire is not connected, corresponding to each of the plurality of the groups, each source pad electrically connected to sources of the unit sense cells of the corresponding group; and
   at least one metal thin film fuse capable of being electrically cut for connecting the center sense pad to the auxiliary sense pad, respectively.

6. The sense FET of claim 5, wherein the unit sense cell groups are composed of different numbers of unit sense cells.

7. The sense FET of claim 5, wherein each of the unit sense cell groups is composed of a predefined number of unit sense cells.

8. The sense FET of claim 5, wherein the structure of the unit sense cells is identical to that of the MOSFET cells of the main cell array.

9. The sense FET of claim 5, wherein the metal thin film fuse is formed to be of a size that can be cut with an overcurrent.

10. The sense FET of claim 5, wherein the metal thin film fuse has a width of 1~5 $\mu$m and a length of 10~20 $\mu$m.

11. The sense FET of claim 8, wherein the number of unit sense cells of the unit sense cell group connected to the center sense pad is higher than the number of unit sense cells arranged in other sense pads.

12. A sense FET comprising:
   a main cell array having a plurality of MOSFET cells connected in parallel;
   a main pad electrically connected to sources of the MOSFET cells of the main cell array;
   a plurality of sense cell arrays composed of a plurality of unit sense cells having gates and drains connected to gates and drains respectively of the MOSFET cells of the main cell array;

a plurality of sense pads corresponding to each of the plurality of sense cell arrays, each sense pad being electrically connected to sources of the unit sense cells of the corresponding sense cell array; and a plurality of metal thin film fuses capable of being electrically cut for connecting the sense pads to each other and to the main pad.

13. The sense FET of claim 12, wherein the sense cell arrays are composed of different numbers of unit sense cells.

14. The sense FET of claim 12, wherein each of the sense cell arrays is composed of a predefined number of unit sense cells.

15. The sense FET of claim 12, wherein the structure of the unit sense cells is identical to that of the MOSFET cells of the main cell array.

16. The sense FET of claim 12, wherein the metal thin film fuse is forced to be of a size that can be cut with an overcurrent.

17. The sense FET of claim 12, wherein the metal thin film fuse has a width of 1~5 $\mu$m and a length of 10~20 $\mu$m.

18. A method of forming a sense FET comprising the steps of:

forming a main cell array having a plurality of MOSFET cells connected in parallel and a plurality of unit sense cells, the unit sense cells arranged in a plurality of groups and having drains and gates connected to drains and gates respectively of the MOSFET cells of the main cell array;

forming a main pad electrically connected to sources of the MOSFET cells of the main cell array and a plurality of sense pads, each sense pad being electrically connected to sources of the unit sense cells of a single group; and forming at least one fuse connecting one of the sense pads to one of the main pad and another one of the sense pads.

19. The method of claim 18, further comprising the step of wire bonding at least one of the sense pads to a terminal of a sense FET package.

20. The method of claim 18, further comprising the step of cutting at least one of the fuses with an overcurrent.

21. The method of claim 18 further comprising the step of forming at least one fuse connecting one of the sense pads to the main pad.

22. The method of claim 19, further comprising the step of cutting at least one of the fuses with an overcurrent.

23. A method of forming a sense FET comprising:

forming a main cell array having a plurality of MOSFET cells connected in parallel and a plurality of unit sense cells, the unit sense cells arranged in a plurality of groups and having drains and gates connected to drains and gates respectively of the MOSFET cells of the main cell array;

forming a main pad electrically connected to sources of the MOSFET cells of the main cell array and a plurality of sense pads, each sense pad being electrically connected to sources of the unit sense cells of a single group;

forming at least one fuse connecting one of the sense pads to one of the main pad and another one of the sense pads; and wire bonding at least one of the sense pads to a terminal of a sense FET package.

24. The method of claim 23 further comprising the step of cutting one of the fuses with an overcurrent.

* * * * *

UNITED STATES PATENT AND TRADEMARK OFFICE
CERTIFICATE OF CORRECTION

PATENT NO.   : 6,433,386 B1
DATED        : August 13, 2002
INVENTOR(S)  : Yun et al.

It is certified that error appears in the above-identified patent and that said Letters Patent is hereby corrected as shown below:

Column 2,
Line 11, "$Id = Vs.(n + 1) / Rs(ext)$" should read -- $Id = Vs \cdot (n + 1) / Rs(ext)$ --;

Column 6,
Line 65, "switches $S_3$, $S_{34}$" should read -- switches $S_{31}$, $S_{34}$ --;

Column 9,
Line 17, "fuse is forced" should read -- fuse is formed --.

Signed and Sealed this

Eight Day of July, 2003

JAMES E. ROGAN
*Director of the United States Patent and Trademark Office*